United States Patent
Yahalom et al.

(10) Patent No.: US 6,723,224 B2
(45) Date of Patent: Apr. 20, 2004

(54) ELECTRO-CHEMICAL POLISHING APPARATUS

(75) Inventors: Joseph Yahalom, Haifa (IL); Srinivas Gandikota, Santa Clara, CA (US); Christopher R. McGuirk, San Jose, CA (US); Deenesh Padhi, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 249 days.

(21) Appl. No.: 09/920,704

(22) Filed: Aug. 1, 2001

(65) Prior Publication Data

US 2003/0024826 A1 Feb. 6, 2003

(51) Int. Cl.$^7$ ............... B23H 3/00; C25F 3/00
(52) U.S. Cl. ............ 205/668; 205/670; 205/640; 205/671; 205/672; 205/650
(58) Field of Search .............. 205/133, 650, 205/668, 670, 640, 671, 672; 204/212, 237, 275.1

(56) References Cited

U.S. PATENT DOCUMENTS

| | | | |
|---|---|---|---|
| 3,208,923 A | 9/1965 | Feiner et al. ............ 204/143 |
| 3,474,013 A | 10/1969 | Inoue ..................... 204/143 |
| 4,304,641 A | 12/1981 | Grandia et al. .......... 204/23 |
| 5,820,744 A | 10/1998 | Edwards et al. ......... 205/640 |
| 5,865,984 A | * 2/1999 | Corbin et al. ............ 205/670 |
| 6,017,437 A | 1/2000 | Ting et al. .............. 205/80 |
| 6,056,869 A | 5/2000 | Uzoh ..................... 205/771 |
| 6,077,412 A | * 6/2000 | Ting et al. .............. 205/143 |
| 6,103,096 A | 8/2000 | Datta et al. ............. 205/686 |
| 6,106,690 A | 8/2000 | Reynolds ............... 205/669 |
| 6,136,163 A | 10/2000 | Cheung et al. .......... 204/198 |
| 6,258,220 B1 | 7/2001 | Dordi et al. |
| 2001/0000396 A1 | * 4/2001 | Dordi et al. ............ 204/212 |
| 2002/0000383 A1 | * 1/2002 | Lee ...................... 205/122 |

FOREIGN PATENT DOCUMENTS

GB 854202 11/1960

* cited by examiner

*Primary Examiner*—Wesley A. Nicolas
(74) *Attorney, Agent, or Firm*—Moser, Patterson & Sheridan

(57) ABSTRACT

Generally, a method and apparatus for electro-chemical polishing a metal layer disposed on a substrate is provided. In one embodiment, the electro-chemical polishing apparatus generally includes a substrate support having a plurality of contact members, a cathode and at least one nozzle. The nozzle is adapted to centrally dispose a polishing fluid on the substrate supported by the substrate support. The cathode is adapted to couple the polishing fluid to a negative terminal of a power source. A positive terminal of the power source is electrically coupled through the contact members to the conductive layer of the substrate. The nozzle creates a turbulent flow in the portion of the polishing fluid boundary layer proximate the center of the substrate which enhances the polishing rate at the center of the substrate.

25 Claims, 6 Drawing Sheets

ELECTRO-CHEMICAL POLISHING APPARATUS

BACKGROUND OF THE INVENTION

1. Field of the Invention

Embodiments of the invention generally relate to a method and apparatus for electro-chemical polishing an exposed conductive layer on a substrate.

2. Background of the Related Art

Sub-quarter micron, multi-level metallization is one of the key technologies for the next generation of ultra large scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die.

As circuit densities increase, the widths of vias, contacts, lines, plugs and other features, as well as the dielectric materials between them, decrease to less than 250 nanometers, whereas the thickness of the dielectric layers remains substantially constant, with the result that the aspect ratios for the features, i.e., their height divided by width, increases. Due to copper's good electrical performance at such small feature sizes, copper has become a preferred metal for filling sub-quarter micron, high aspect ratio interconnect features on substrates. However, many traditional deposition processes, such as physical vapor deposition (PVD) and chemical vapor deposition (CVD), have difficulty filling structures with copper material where the aspect ratio exceed 4:1, and particularly where it exceeds 10:1. As a result of these process limitations, electroplating, which had previously been limited to the fabrication of lines on circuit boards, is now being used to fill vias and contacts on semiconductor devices.

Metal electroplating is generally known and can be achieved by a variety of techniques. A typical method generally comprises physical vapor deposition of a barrier layer over the feature surfaces, followed by physical vapor deposition of a conductive metal seed layer, preferably copper, over the barrier layer, and then electroplating a conductive metal over the seed layer to fill the structure/feature. After electroplating, the deposited layers and the dielectric layers are planarized, such as by chemical mechanical polishing, to define a conductive interconnect feature.

Chemical mechanical polishing of copper is difficult. Copper, generally softer than surrounding materials such as oxides, tends to dish during polishing, particularly over large line widths. To maintain planarity during polishing, copper is often polished at a reduced rate compared to typical oxide polishes. As substrate throughput is highly desired, a method of polishing that provides an alternative or facilitates reducing the amount of chemical mechanical polishing systems is desirable.

Electroplating has promise as complementary process or an alternative to chemical mechanical polishing systems. Electroplating generally involves exposing the metal layer (e.g., copper) to an electrolytic fluid. A power source couples a cathode to the metal layer through the electrolytic fluid. As power (usually in the form of a direct current) is applied between the metal layer and the cathode, metal ions are removed from metal layer and dissolved in the electrolyte. The dissolution reaction is $Cu \rightarrow Cu^{++} + 2\,e^{-}$. If the electropolishing electrolyte is phosphoric acid, the $Cu^{++}$ ions combine with $(PO_4)^{-}$ ions, to form a viscous boundary layer of saturated solution of the copper phosphate salt over the metal surface. The boundary layer is electrically more resistive than the bulk of the electrolyte. The reason for the increased resistivity is the lower mobility of $Cu^{++}$ ions in the salt solution compared with that of $H^{+}$ ions In the acid. If the outer interface between the boundary layer and the electrolyte is flat, the path through the resistive boundary layer from the top of high points on the metal surface to the bulk of the electrolyte is shorter than that from valleys. As a result, the electric current carried by $Cu^{++}$ ions is higher from higher points which, in turn, results in preferential dissolution of the high points. The net result is flattening of the surface.

One problem that has prevented the application of electroplating in substrate fabrication is the difficulty of controlling the uniformity of material removal from the metal layer, particularly when the substrate having a copper layer is rotating in a bath of electrolyte. The local current density determines the rate of copper dissolution at any point on the metal layer. The voltage between the electrolyte and the metal layer and the local resistance across the electrolyte determine the local current density. One factor contributing to the local resistance which controls local current density, and thus, the local copper dissolution rate, is the local thickness of a resistive boundary layer that forms between the wafer and the bulk of the electrolyte over any particular location of the metal layer.

Since the wafer is generally rotated during the electroplating process, the boundary layer of the electrolytic fluid is generally thicker at the center of the wafer due to slower linear velocities of the electrolytic fluid across the substrate surface compared with the outer regions of the wafer, due to the round geometry. The thicker resistive boundary layer near the center increases the local resistance, thereby lowering the local current density. The result is slow polishing at the center and faster polishing near the perimeter of the substrate.

The faster polishing near the perimeter of the substrate also aggravates a second factor that contributes to uniform non-uniform polishing. As the electrical contacts between the power source and the metal layer are generally made at the perimeter of the substrate, the resistance between a given point on the metal layer and the electrical contacts increases towards the center of the wafer. Since the resistance through the metal layer is greater when measured farther from the electrical contacts, the increased resistance across the metal layer toward the center results in more sluggish polishing at the center of the wafer. The combination of the two effects results is a metal layer that is substantially thinner near the perimeter of the substrate.

Therefore, there is a need for an improved method and apparatus for polishing a metal layer disposed on a substrate.

SUMMARY OF THE INVENTION

In one aspect of the invention, an apparatus for electro-chemical polishing a metal layer disposed on a substrate is provided. In one embodiment, the electro-chemical polishing apparatus generally includes a substrate support having a plurality of contact members, a cathode and at least one nozzle. The nozzle is adapted to centrally deliver a polishing fluid on a substrate supported by the substrate support. The cathode is adapted to couple the polishing fluid to a negative terminal of a power source. A positive terminal of the power source is electrically coupled through the contact members to the conductive layer of the substrate. The nozzle creates a turbulent flow in the portion of the polishing fluid boundary layer proximate the center of the substrate, which enhances the polishing rate at the center of the substrate.

In another aspect of the invention, a method for polishing a substrate having an exposed conductive layer is provided. In one embodiment, the method for polishing a substrate having an exposed conductive layer includes the steps of coupling a polishing fluid to a negative terminal of the power source, coupling the exposed conductive layer to a positive terminal of the power source and centrally delivering the polishing fluid on the substrate.

In another embodiment of the invention, a method for polishing a substrate having an exposed conductive layer includes the steps of flowing a polishing fluid onto the substrate, the polishing fluid forming a boundary layer adjacent the substrate, creating an area of greater turbulence in a center region of the polishing fluid boundary layer relative to a radially disposed region and flowing electrical current across the boundary layer to the conductive layer.

BRIEF DESCRIPTION OF THE DRAWINGS

So that the manner in which the above-recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Generally, a method and apparatus for electroplating a conductive layer exposed on a substrate is provided. The method and apparatus generally provides control of the current density that drives the electro-polish of the conductive layer resulting in controllable metal polishing uniformity across the substrates surface.

Figure 1:
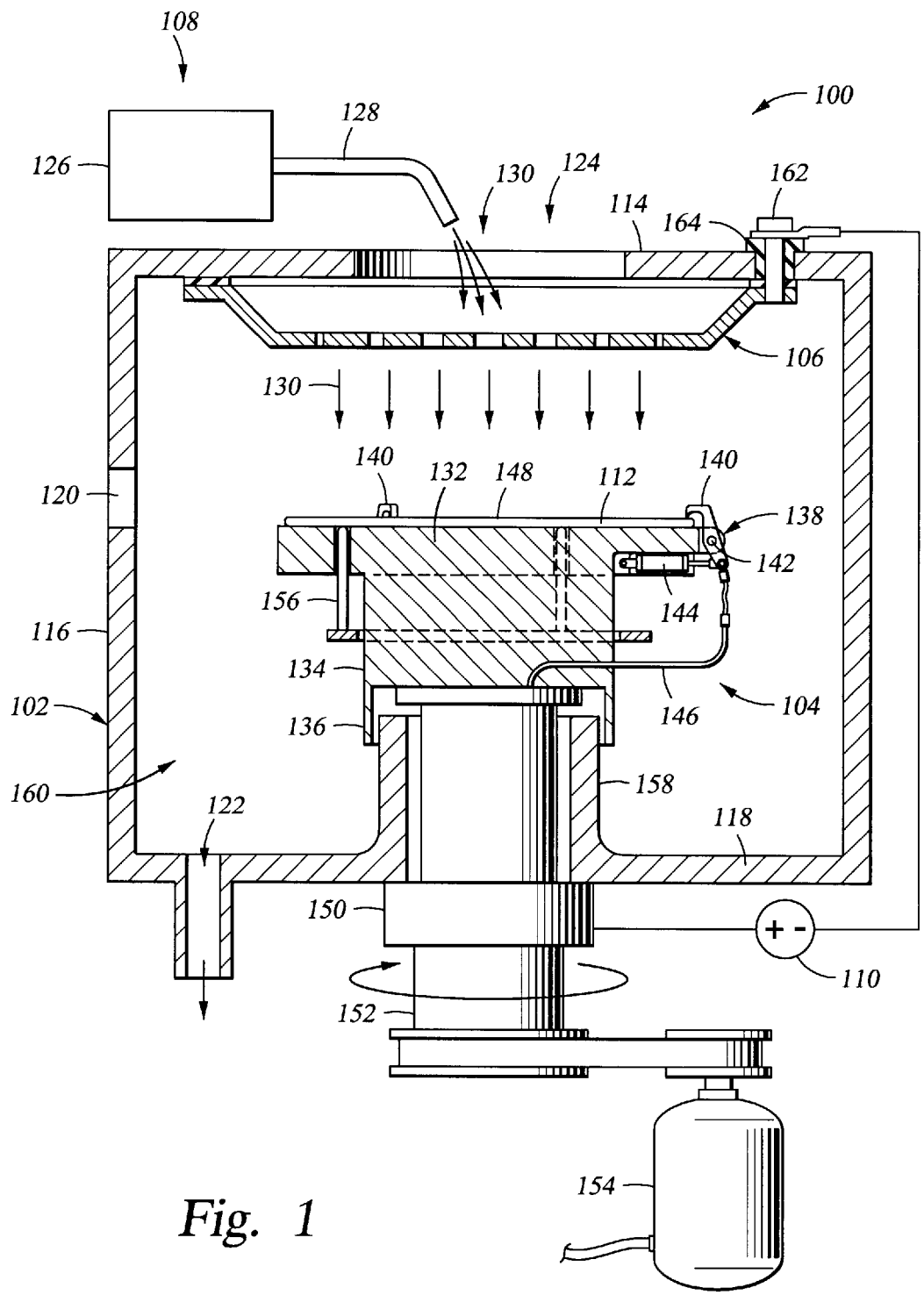
FIG. 1 is a sectional view of one embodiment of an electroplating apparatus.

FIG. 1 depicts one embodiment of an electroplating apparatus 100. The apparatus 100 generally includes a housing 102, a substrate support 104, a fluid delivery system 108 and a power source 110. A substrate 112 having an at least partially exposed conductive layer, such as metal like copper or aluminum, is process in the apparatus 100 generally by positioning the substrate 112 within the housing 102 on the substrate support 104. The substrate 112 is coupled to a positive terminal of the power source 110. The fluid delivery system 108 flows a polishing fluid 130 that is electrically coupled through a cathode electrode to a negative terminal of the power source 110. As power applied between the polishing fluid 130 and the substrate 112, the conductive layer is polished.

The housing 102 is generally comprised of a material that is compatible with the polishing process such as stainless steel or a polymer. The housing 102 typically includes side walls 116 and a bottom 118 that define a basin 160. The housing 102 may optionally include a top 114 disposed on the side walls 116. An access port 120 is generally disposed in the side walls 116 to permit entry and egress of the substrate 112 from the interior of the housing 102.

The substrate support 104 is generally fabricated from a material compatible with the polishing fluid 130 and includes a support surface 132 disposed on a central body 134. The body 134 is supported above the bottom 118 of the housing 102 by a shaft 152. The body 134 includes a sleeve 136 extending therefrom that covers an upper end of a lip 158 such that polishing fluid 130 flowing down the substrate support 104 into the basin 160 does not flow out the housing 102 along the shaft 152. A motor 154 is coupled to the shaft 152 below the housing 102 to provide rotary motion to the substrate support 104.

The support surface 132 is configured to support the substrate 112 during processing. The support surface 132 generally has at least one slot 138 formed in the perimeter of the substrate support 104. The slot 138 is configured to accept a contact member 140 that is pivotally mounted to the substrate support 104 by a pin 142 passing therethrough. The contact member 140 is generally fabricated from a conductive material, preferably platinum or titanium or other conductive material or coating. The contact member 140 may be made of a conductive material disposed over a base material. For example, a copper, stainless steel, molybdenum or other base material be coated with platinum or titanium. The contact member 140 is coupled by a lead 146 that is routed through the shaft 152 to a slip ring 150. The slip ring 150 allows the lead to maintain electrical connection with a positive terminal of the power source 110 while the substrate support 104 rotates.

Preferably, a plurality of contact members 142 are equally spaced about the perimeter of the substrate support 104 to provide substantially uniform current distribution across the conductive layer. The number of contact members 142 may be varied as desired. For a 200 mm substrate, preferably at least twenty-four contact members 142 are spaced equally around the perimeter of the substrate 112. However, as the number of contact members 142 reaches a critical level, the compliance of the substrate 112 may be adversely affected. Therefore, while more than twenty-four contact members 142 may be used, contact uniformity may eventually diminish depending on the topography of the contact members 142 and the substrate stiffness. Similarly, while less than twenty-four contact members 142 may be used, current flow is increasingly restricted and localized, leading to less than optimum polishing results. Since the dimensions of the present invention are readily altered to suit a particular application (for example, a 300 mm substrate), the optimal number of contact members 142 may easily be determined for varying scales and embodiments.

In addition to being a function of the contact material, the total resistance of each circuit is dependent on the geometry, or shape, of the contact point of the contact members 142 and the force of the members 142 on the conductive layer. These factors define a constriction resistance, $R_{CR}$, at the interface of the contact members 142 and the conductive layer due to asperities between the two surfaces. Generally, as the applied force is increased the apparent area is also increased. The apparent area is, in turn, inversely related to $R_{CR}$ so that an increase in the apparent area results in a decreased $R_{CR}$. Thus, to minimize overall resistance it is preferable to maximize force. The maximum force applied in operation is limited by the yield strength of a substrate that may be damaged under excessive force and resulting pressure. However, because pressure is related to both force and area, the maximum sustainable force is also dependent on the geometry of the contact members 142. Thus, while the contact members 142 may have a knife-edge point as in FIG. 1, other shapes may be used to advantage. A more complete discussion of the relation between contact geometry, force, and resistance is given in Ney Contact Manual, by Kenneth E. Pitney, The J. M. Ney Company, 1973, which is hereby incorporated by reference in its entirety.

The polishing fluid delivery system 108 generally includes a fluid supply 126 and at least one nozzle or nozzle 128 coupled thereto. The polishing fluid delivery system 108 generally provides polishing fluid 130 such as an electrolyte from the fluid supply 126 through an opening 124 in the top 114 of the housing 102 to the substrate 112. In one embodiment, the nozzle 128 flows the polishing fluid 130 onto a showerhead 106 coupled to the top 114 of the housing 102. The showerhead 106 generally controls the distribution of the polishing fluid 130 across the diameter of the substrate 112.

The polishing fluid 130 is generally coupled to the negative terminal of the power source 110 through a cathode electrode. The cathode electrode may make electrical contact with the polishing fluid 130 by flowing the polishing fluid 130 in contact with component or through a conductive tube coupled to the power source 110. In one embodiment, the showerhead 106 serves as the cathode electrode. The negative terminal of the power source 110 is coupled to the showerhead 106 by a terminal 162 disposed through the top 114 of the housing 102. Typically, an insulative sleeve 164 isolates the housing 102 from terminal 162 and the power source 110.

Figure 2:
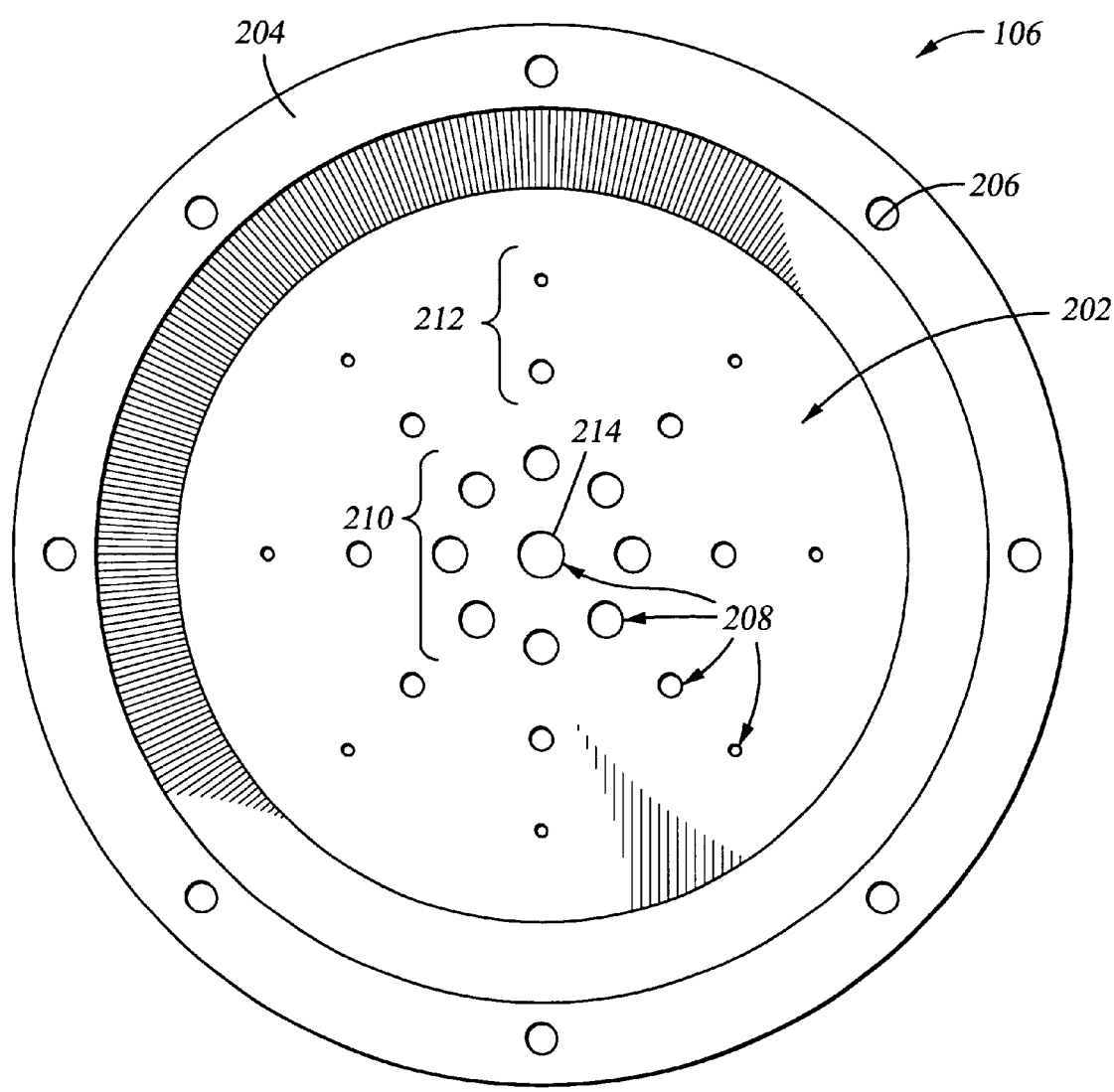
FIG. 2 is a bottom plan view of a showerhead.

FIG. 2 depicts a bottom plan view of the showerhead 106. The showerhead 106 is generally fabricated from an electrically conductive material compatible with the polishing fluid 130, for example, copper. The showerhead 106 is typically cylindrical in form and includes a perforated center area 202 surrounded by a mounting flange 204. The mounting flange 204 generally includes a plurality of threaded holes 206 which facilitate fastening the showerhead 106 to the top 114 of the housing 102. The perforated center area 202 generally includes a plurality of apertures 208 that allow the polishing fluid 130 therethrough. The apertures 208 are generally configured to provide a higher rate of polishing fluid 130 through the center portion of the showerhead 106 to corresponding create turbulence at the center portion of the substrate. For example, a center region 210 of the perforated center area 202 may include greater open area relative to an outer region 212 of the perforated center area 202. Alternatively, the center aperture or apertures 214 may be larger than the other apertures 208 disposed radially outward thereof.

Figure 3:
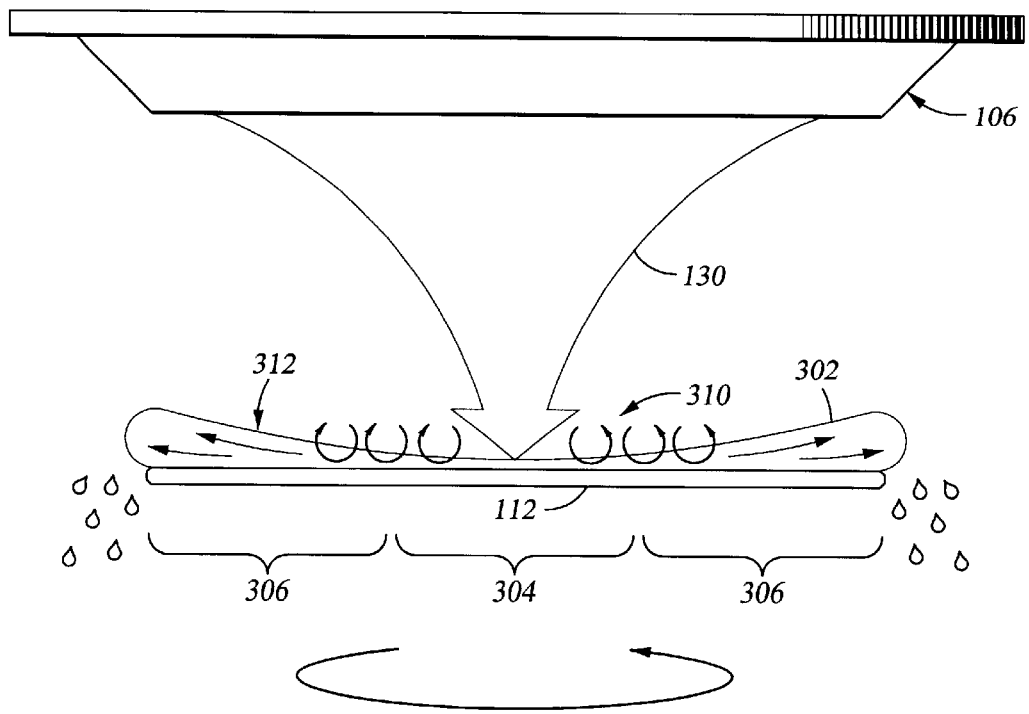
FIG. 3 is a schematic diagram depicting the boundary layer and conductive metal layer resistance relative to radial position on a substrate.

FIG. 3 depicts the surface of the substrate 112 having the polishing fluid 130 disposed thereon. The polishing fluid 130 generally includes a boundary layer 302 disposed adjacent the surface of the substrate 130. The showerhead 106 generally directs more polishing fluid 130 onto a center portion 304 of the substrate 112 that results in a turbulent flow that locally thins a center region 310 the boundary layer 302 (adjacent the center portion 304). As the flow moves radially toward an outer portion 306 of the substrate 112, the flow becomes less turbulent (and may become laminar), thus allowing a radial region 312 of the boundary layer 302 to thicken as it approaches the perimeter of the substrate 112. Since the resistance across the boundary layer 302 is generally dependent on the thickness of the boundary layer 302, the local resistance through the polishing fluid 130 to the substrate 112 is reduced towards the center. In other words, the resistance across the center region 310 of the boundary layer 302 is less than the radial region 312. As the polishing rate is proportional to the current density locally at the substrate, the reduction in boundary layer resistance may be used to balance the increased resistance across the conductive layer (from the contact members inward towards the center of the substrate 112) to provide uniform polishing results. Alternatively, the thickness (i.e. turbulence and hence resistance) may be tailored to yield a faster polishing rate in one portion of the substrate relative to another portion positioned at a different radial position on the substrate. Such results may also be realized in other polishing apparatus that flow polishing fluid to substrates mounted in other orientations, for example, flowing fluid horizontally to a vertically disposed substrate, flowing fluid upwards to a substrate having a conductive layer facing downwards and other configurations.

Figure 4:
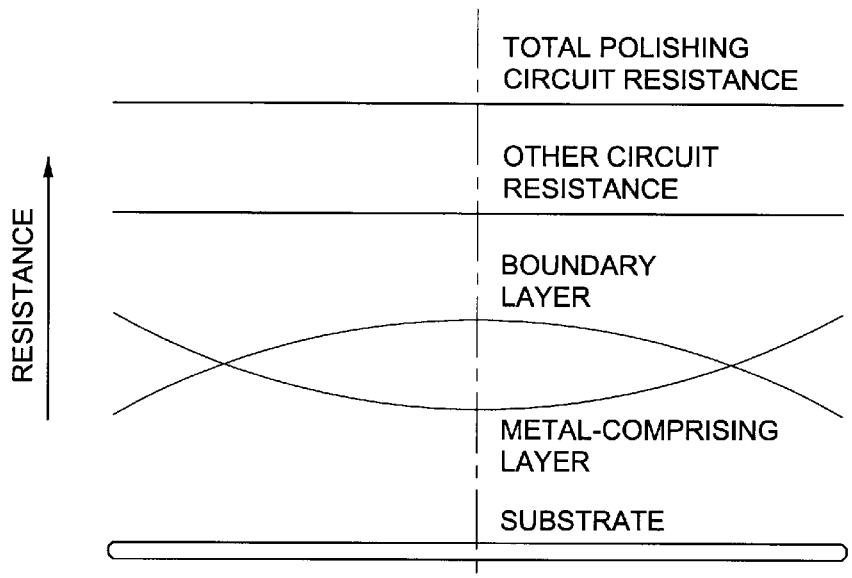
FIG. 4 is a graph of polishing circuit resistance vs. substrate diameter.

FIG. 4 provides a graphic illustration of the polishing circuit resistance versus substrate diameter. As described with reference to FIG. 3, the resistance of the boundary layer may be influenced by controlling the amount of turbulence near the center of the substrate. Thus, the total circuit resistance may be uniform across the substrate to provide uniform polishing as shown in FIG. 4, or the resistance of the boundary layer may be shaped by adjusting the location and amount of turbulence to cause more polishing in one area of the substrate relative to another area at a different distance from the center of the substrate.

Controlling the rotation of the substrate 112 adds an additional measure of control of the boundary layer thickness, particularly near the perimeter of the substrate. However, substrate rotation is not necessary for the creation of the turbulent portion of the boundary layer proximate the center of the substrate. As such, rotation of the substrate is not necessary to achieve uniform electroplating in some instances, particularly where the uniformity of electroplating is achieved by adjusting the processing parameters, such as the polishing fluid chemistry, polishing fluid flow, the distance between the nozzle and the substrate and other parameters.

Figure 5:
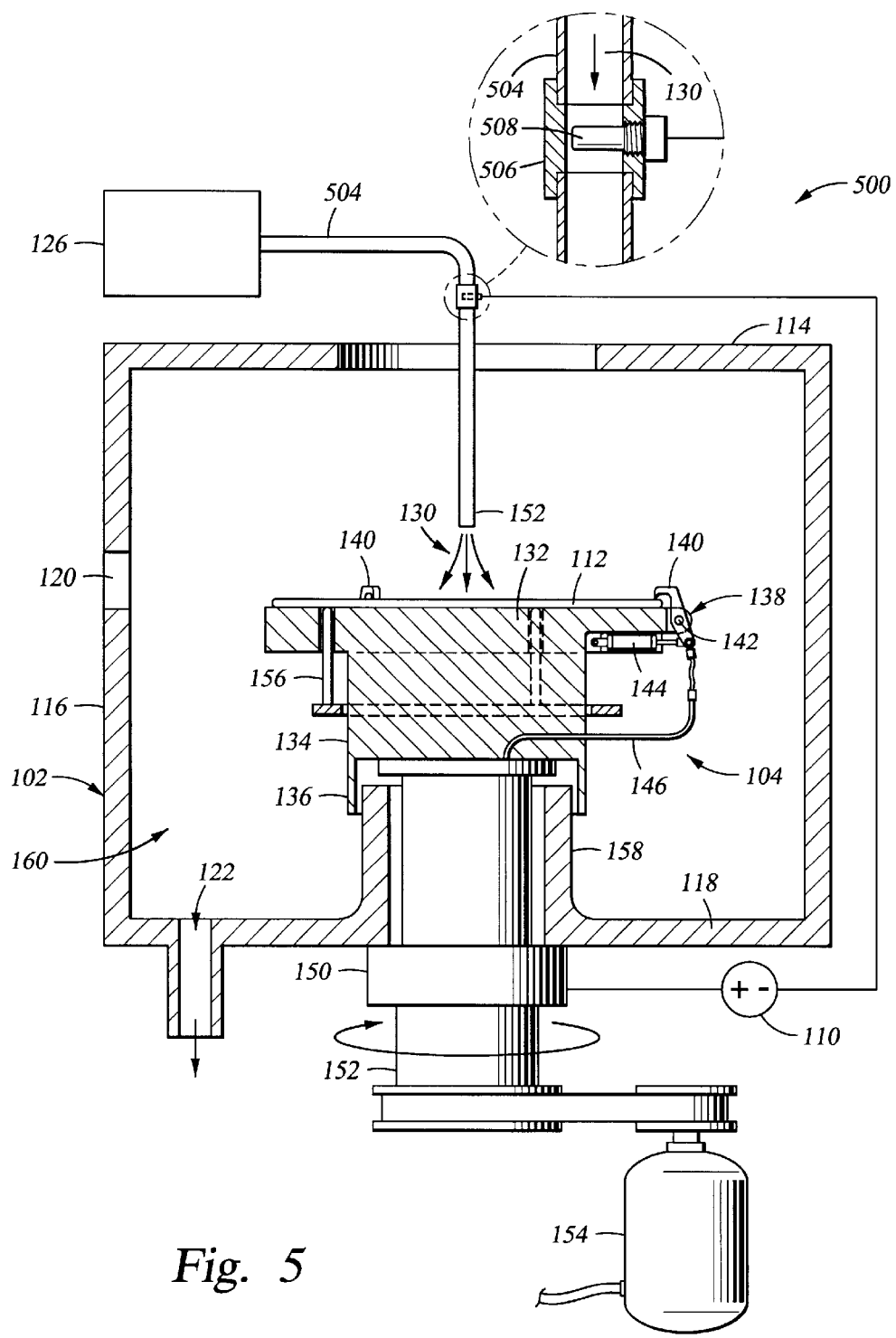
FIG. 5 is a sectional view of another embodiment of an electroplating apparatus.

FIG. 5 depicts a sectional view of another embodiment of an electroplating system 500 that produces increase the turbulence of the polishing fluid boundary layer towards the center portion of the substrate 112. Generally, the electroplating system 500 is configured similar to the electroplating system 100 described with reference to FIG. 1 except that at least one nozzle 502 is adapted to deliver the polishing fluid directly to the substrate 112. Generally, a negative terminal of a power source 110 is coupled to an electrically conductive portion of a polishing fluid delivery line 504 that flows the polishing fluid 130 to the nozzle 502. The nozzle 502 directly flows the polishing fluid to the center portion of the substrate 112 without passing through a showerhead or other distribution device. The electrical connection between the polishing fluid 130 and the power source 110 may be made through a conductive portion of the delivery tube 504 itself, or alternatively, an electrode 508 may be disposed within the tube 504 in contact with the polishing fluid 130. The electrode may optionally be disposed outside the delivery tube and have the polishing fluid flow thereover. Positioning the electrode external to the delivery tube 504 removes the source of hydrogen gas bubbles from the tube 504 that may emanate on the electrode 508 and may clog the passage of polishing fluid 130 through the nozzle 502. An insulator 506 may be coupled between the delivery tube 504 and electrode 508 to isolate the electrode 508 from the environment outside the tube 504.

In one embodiment, the nozzle 502 flows about 3.8 to about 22.8 l/min of polishing fluid 130 towards the center of the substrate 112. The nozzle 502 is generally disposed about 1 to about 160 mm and preferably about 10 to about 20 mm from the substrate 112. Other configurations may alternatively be configured to provide turbulent flow in the boundary layer. In embodiments having more than one nozzles, the flow of polishing fluid is generally greatest proximate the center of the substrate. Having more flow in the center of the substrate allows for lower radial velocity of the polishing fluid 130 near the substrates perimeter as the fluid spreads across the substrates diameter which assists in thinning the boundary layer resulting in a less resistive boundary layer at radial distances closer to the center.

Figure 6:
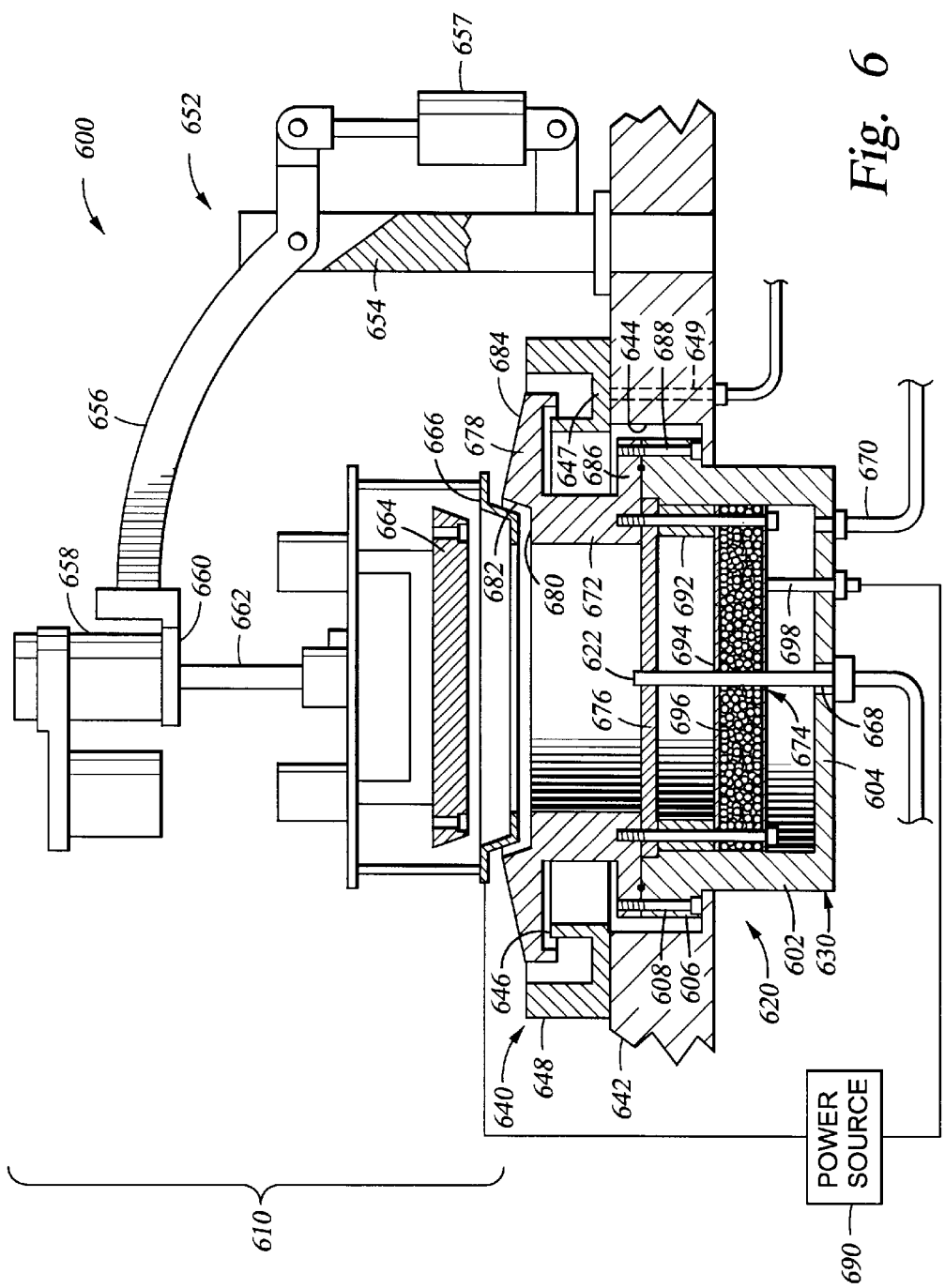
FIG. 6 is a sectional view of an electroplating and polishing apparatus.

FIG. 6 is a cross-sectional view of process cell 600 that may be utilized to perform both electroplating and electropolishing according to the invention. One system that may be adapted to benefit from the invention is described in commonly assigned U.S. patent application Ser. No. 09/289,074, filed Apr. 8, 1999 by Dordi et al., and is hereby incorporated by reference in its entirety.

The processing cell 600 generally comprises a head assembly 610, a process kit 620 and a polishing fluid collector 640. Preferably, the polishing fluid collector 640 is secured onto a body 642 over an opening 644 that defines the location for placement of the process kit 620. The polishing fluid collector 640 includes an inner wall 646, an outer wall 648 and a bottom 647 connecting the walls. An electrolyte nozzle 649 is disposed through the bottom 647 of the polishing fluid collector 640 and connected to the electrolyte replenishing system (not shown) through tubes, hoses, pipes or other fluid transfer connectors.

The head assembly 610 is mounted onto a head assembly frame 652. The head assembly frame 652 includes a mounting post 654 and a cantilever arm 656. The mounting post 654 is mounted onto the body 642, and the cantilever arm 656 extends laterally from an upper portion of the mounting post 654. Preferably, the mounting post 654 provides rotational movement with respect to a vertical axis along the mounting post to allow rotation of the head assembly 610. The head assembly 610 is attached to a mounting plate 660 disposed at the distal end of the cantilever arm 656. The lower end of the cantilever arm 656 is connected to a cantilever arm actuator 657, such as a pneumatic cylinder, mounted on the mounting post 654. The cantilever arm actuator 657 provides pivotal movement of the cantilever arm 656 with respect to the joint between the cantilever arm 656 and the mounting post 654. When the cantilever arm actuator 657 is retracted, the cantilever arm 656 moves the head assembly 610 away from the process kit 620 to provide the spacing required to remove and/or replace the process kit 620 from the electroplating process cell 600. When the cantilever arm actuator 657 is extended, the cantilever arm 656 moves the head assembly 610 toward the process kit 620 to position the wafer in the head assembly 610 in a processing position.

The head assembly 610 generally comprises a wafer holder assembly 650 and a wafer assembly actuator 658. The wafer assembly actuator 658 is mounted onto the mounting plate 660, and includes a head assembly shaft 662 extending downwardly through the mounting plate 660. The lower end of the head assembly shaft 662 is connected to the wafer holder assembly 650 to position the wafer holder assembly 650 in a processing position and in a wafer loading position. The wafer holder assembly 650 generally comprises a wafer holder 664 and a contact ring 666.

Figure 7:
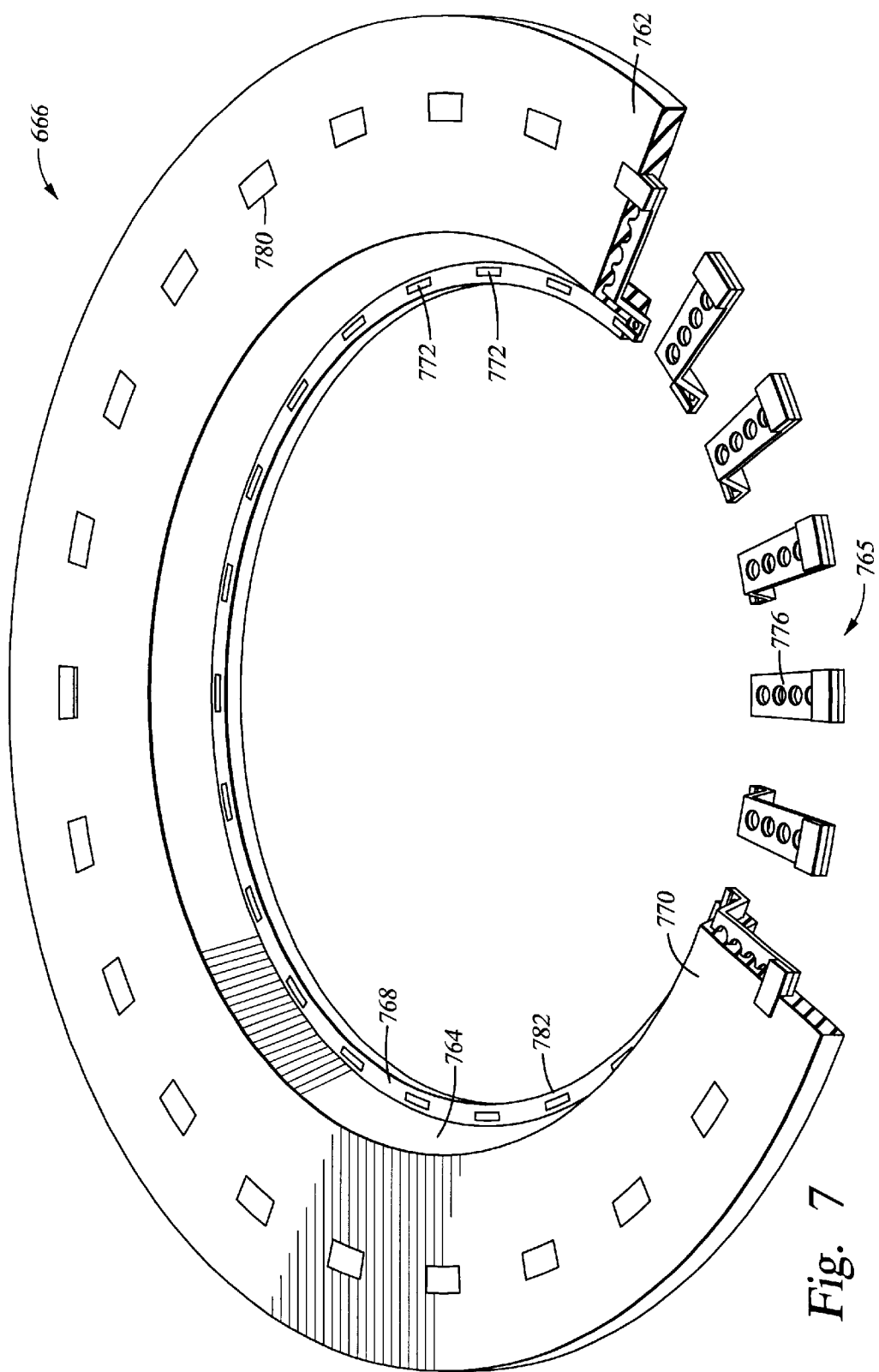
FIG. 7 is a partial sectional perspective view of a contact ring.

FIG. 7 is a cross sectional view of one embodiment of a contact ring 666 of the present invention. In general, the contact ring 666 comprises an annular body having a plurality of conducting members disposed thereon. The annular body is constructed of an insulating material to electrically isolate the plurality of conducting members. Together the body and conducting members form a diametrically interior substrate seating surface which, during processing, supports a substrate and provides a current thereto.

The contact ring 666 generally comprises a plurality of conducting members 765 at least partially disposed within an annular insulative body 770. The insulative body 770 is shown having a flange 762 and a downward sloping shoulder portion 764 leading to a substrate seating surface 768 located below the flange 762 such that the flange 762 and the substrate seating surface 768 lie in offset and substantially parallel planes. Thus, the flange 762 may be understood to define a first plane while the substrate seating surface 768 defines a second plane parallel to the first plane wherein the shoulder 764 is disposed between the two planes. However, contact ring design shown in FIG. 7 is intended to be merely illustrative. In another embodiment, the shoulder portion 764 may be of a steeper angle including a substantially vertical angle so as to be substantially normal to both the flange 762 and the substrate seating surface 768. Alternatively, the contact ring 666 may be substantially planar thereby eliminating the shoulder portion 764.

The conducting members 765 are defined by a plurality of outer electrical contact pads 780 annularly disposed on the flange 762, a plurality of inner electrical contact members 772 disposed on a portion of the substrate seating surface 768, and a plurality of embedded conducting connectors 776 which link the pads 772, 780 to one another. The conducting members 765 are isolated from one another by the insulative body 770 which may be made of a plastic or any other insulating material. The outer contact pads 780 are coupled to a power source 690 (see FIG. 6) to deliver current and voltage to the inner contact members 772 via the connectors 776 during processing. The inner contact members 772 supply the current and voltage to a substrate by maintaining contact around a peripheral portion of the substrate. Thus, in operation the conducting members 765 act as discrete current paths electrically connected to a substrate.

The conducting members 765 are preferably made of copper, platinum, titanium or other conducting materials. The conducting members 765 may alternatively be coated with a conducting material.

The number of connectors 776 may be varied depending on the particular number of contact members 772 (shown in FIG. 7) desired. For a 200 mm substrate, preferably at least twenty-four connectors 776 are spaced equally over 360 degrees. However, as the number of connectors reaches a critical level, the compliance of the substrate relative to the contact ring 666 is adversely affected. Therefore, while more than twenty-four connectors 776 may be used, contact uniformity may eventually diminish depending on the topography of the contact members 772 and the substrate stiffness. Similarly, while less than twenty-four connectors 776 may be used, current flow is increasingly restricted and localized, leading to poor plating results. Since the dimensions of the present invention are readily altered to suit a particular application (for example, a 300 mm substrate), the optimal number may easily be determined for varying scales and embodiments.

Rotation of the head assembly is not necessary to achieve uniform electroplating and electropolishing in some instances, particularly where the uniformity of electroplating and electropolishing is achieved by adjusting the processing parameters, such as the polishing fluid chemistry, polishing fluid flow, dispense distances and other parameters.

Referring back to FIG. 6, the wafer holder assembly 650 is positioned above the process kit 620. The process kit 620 generally comprises a bowl 630, a container body 672, a electrode assembly 674 and a finer 676. The electrode assembly 674 generally serves as an anode during an electroplating mode and as a cathode in an electropolishing mode. Preferably, the electrode assembly 674 is disposed below the container body 672 and attached to a lower portion of the container body 672, and the filter 676 is disposed between the electrode assembly 674 and the container body 672. The container body 672 is preferably a cylindrical body comprised of an electrically insulative material, such as a ceramic or plastic, but may alternatively comprise a metal coated with an insulating layer that is compatible with the electrolyte and can be electrically insulated from the electrodes (i.e., the anode and cathode of the electroplating and polishing system, respectfully). The container body 672 is preferably sized and adapted to conform to the shape of the wafer being processed through the system and is typically circular or rectangular in form. One preferred embodiment of the container body 672 comprises a cylindrical ceramic tube having an inner diameter that has about the same dimension as or slightly larger than the wafer diameter.

An upper portion of the container body 672 extends radially outwardly to form an annular weir 678. The weir 678 extends over the inner wall 646 of the polishing fluid collector 640 and allows the electrolyte to flow into the polishing fluid collector 640. The upper surface of the weir 678 preferably matches the lower surface of the contact ring 666. Preferably, the upper surface of the weir 678 includes an inner annular flat portion 680, a middle inclined portion 682 and an outer declined portion 684. When a wafer is positioned in the processing position, the wafer surface is positioned above the cylindrical opening of the container body 672, and a gap for electrolyte flow is formed between the lower surface of the cathode contact ring 666 and the upper surface of the weir 678. The lower surface of the cathode contact ring 666 is disposed above the inner flat portion 680 and the middle inclined portion of the weir 678. The outer declined portion 684 is sloped downwardly to facilitate flow of the electrolyte into the polishing fluid collector 640.

A lower portion of the container body 672 extends radially outwardly to form a lower annular flange 686 for securing the container body 672 to the bowl 630. The outer dimension (i.e., circumference) of the annular flange 686 is smaller than the dimensions of the opening 644 and the inner circumference of the polishing fluid collector 640 to allow removal and replacement of the process kit 620 from the electroplating process cell 600.

Preferably, the filter 676 is attached to and completely covers the lower opening of the container body 672, and the electrode assembly 674 is disposed below the filter 676. A spacer 692 is disposed between the filter 676 and the electrode assembly 674. Preferably, the filter 676, the spacer 692, and the electrode assembly 674 are removably fastened to a lower surface of the container body 672 or the bowl 630.

The electrode assembly 674 also serves as an anode during an electroplating mode. The electrode assembly 674 preferably comprises a consumable anode that serves as a metal source in the plating fluid or electrolyte. Alternatively, the electrode assembly 674 comprises a non-consumable anode, and the metal to be electroplated is supplied within the electrolyte from the electrolyte replenishing system. As shown in FIG. 6, the electrode assembly 674 is a self-enclosed module having a porous anode enclosure 694. A soluble metal 696, such as high purity copper, may be disposed within the anode enclosure 694 during a plating mode. The soluble metal 696 preferably comprises metal particles, wires or a perforated sheet. The porous anode enclosure 694 also acts as a filter that keeps the particulates generated by the dissolving metal within the anode enclosure 694.

An electrode contact 698 is inserted through the anode enclosure 694 to provide electrical connection to the soluble metal 696 to the power source 690. Preferably, the electrode contact 698 is made from a conductive material that is insoluble in the electrolyte, such as titanium, platinum and platinum-coated stainless steel. The electrode contact 698 extends through the bowl 630 and is connected to the electrical power source 690.

The bowl 630 generally comprises a cylindrical portion 602 and a bottom portion 604. An upper annular flange 606 extends radially outwardly from the top of the cylindrical portion 602. The upper annular flange 606 includes a plurality of holes 608 that matches the number of bolts 688 from the lower annular flange 686 of the container body 672. To secure the upper annular flange 606 of the bowl 630 and the lower annular flange 686 of the container body 672, the bolts 688 are inserted through the holes 608, and the fastener nuts are fastened onto the bolts 688. Preferably, the outer dimension (i.e., circumference) of the upper annular flange 606 is about the same as the outer dimension (i.e., circumference) of the lower annular flange 686.

The inner circumference of the cylindrical portion 602 accommodates the electrode assembly 674 and the filter 676. Preferably, the outer dimensions of the filter 676 and the electrode assembly 674 are slightly smaller than the inner dimension of the cylindrical portion 602 to force a substantial portion of the electrolyte to flow through the electrode assembly 674 first before flowing through the filter 676. The bottom portion 604 of the bowl 630 includes a first polishing fluid inlet 668 and a second polishing fluid inlet 670 that connects to an electrolyte supply line from the electrolyte replenishing system. Preferably, the electrode assembly 674 is disposed about a middle portion of the cylindrical portion 602 of the bowl 630 to provide a gap for electrolyte flow between the electrode assembly 674 and the first polishing fluid inlet 668 on the bottom portion 604.

The first polishing fluid inlet 668 is generally disposed in a position to flow electrolyte to the center region of the substrate. In one embodiment, first polishing fluid inlet 668 is centrally disposed in the bottom portion 604 of the bowl 630. Polishing fluid (e.g., electrolyte) generally fills the bowl 630.

The second polishing fluid inlet 670 generally extends from the bottom portion 604 of the bowl 630 through the electrode assembly 674 and filter 676. The second polishing fluid inlet 670 terminates in a nozzle 622 disposed between the filter 676 and substrate so that polishing fluid may be disposed directly to the center portion of the substrate from the nozzle 622. The nozzle 622 of the second polishing fluid inlet 670 is generally disposed about 1 to about 160 mm and preferably about 10 to about 20 mm from the substrate. The second polishing fluid inlet 670 generally flows about 3.8 to about 22.8 l/min of electrolyte to the center of the substrate. Other configurations may be alternatively configured to provide turbulent flow at the boundary layer. The second polishing fluid inlet 670 generally directs electrolyte fluid to the center portion of the wafer at a rate which creates turbulent flow of at least the center portion of the boundary layer.

The first and second polishing fluid inlets 668, 670 and the electrolyte supply line are preferably connected by a releasable connector that facilitates easy removal and replacement of the process kit 620. When the process kit 620 needs maintenance, the electrolyte is drained from the process kit 620, and the electrolyte flow in the electrolyte supply line is discontinued and drained. The connector for the electrolyte supply line is released from the polishing fluid inlets 668, 670 and the electrical connection to the electrode assembly 674 is also disconnected. The head assembly 610 is raised or rotated to provide clearance for removal of the process kit 620. Alternatively, the bowl 630 can be secured onto the support flange, and the container body 672 along with the cathode and the filter are removed for maintenance.

In a plating mode of operation, a positive terminal of the power supply to the electrode contact 698. The negative terminal of the power source 690 is coupled to the inner contact members 772 that are in contact with the substrate. As electrolyte flows from the first polishing fluid inlet 668 to the substrate, metal ions are released from the electrode assembly 674 and traveling through the process kit 620 and filter 676 with the electrolyte to the substrate. Upon reaching the substrate, the metal ions in the electrolyte are deposited on the substrate.

In an electroplating mode of operation, the positive terminal of the power source 690 is coupled to the inner contact members 772 while the negative terminal of the power source 690 is coupled to the electrode contact 698. Electrolyte fluid flowing from the second polishing fluid inlet 670 is directed at the center portion of the substrate. The electrolyte flowing against the center region of the substrate creates a turbulent region in the center of the boundary layer of the electrolyte fluid. As the boundary layer is more turbulent at the center region of the substrate relative to the regions proximate the perimeter, the boundary layer is thereby reduced in the center regions, allowing for more current density and enhancing electroplating proximate the center region of the wafer of the substrate.

As the boundary layer helps control the electropolish unifomity, forming the boundary layer rapidly is desirable. Since boundary layer formation is influenced by the rotational speed of the substrate and the flow rate of the electrolyte fluid, the rotational speed and flow rate may be set to promote forming the boundary layer. For example, the substrate may be rotated at a rate of less than 115 rpm during a first period. The lack or little radial velocity of the electrolyte fluid promotes boundary layer formation. During a second period, the substrate may be rotated faster then the first rate. In another example, the flow of electrolyte fluid may be less than 3.8 l/min over a first period. In one embodiment, the electrolyte fluid may be stagnant on the substrate. During a second period, the flow of electrolyte fluid may be increased to a second rate greater than the first rate. Additionally, control of substrate rotation and electrolyte fluid flow may be combined to enhance boundary layer formation.

While the foregoing is directed to the preferred embodiment of the present invention, other and further embodiments of the invention may be devised without departing from the basic scope thereof. The scope of the invention is determined by the claims which follow.

What is claimed is:

1. A method for polishing a substrate having an exposed conductive layer, the method comprising:

coupling a polishing fluid to a negative terminal of a power source;

coupling a positive terminal of the power source to the exposed conductive layer;

delivering the polishing fluid to a center portion of the substrate; and creating a central turbulent region in the boundary layer of the polishing fluid disposed on the substrate.

2. The method of claim 1, wherein the step of coupling the polishing fluid to a negative terminal further comprises:

the step of coupling the negative terminal to a tube or showerhead having the polishing fluid flowing therethrough.

3. The method of claim 1, wherein the step of coupling the exposed conductive layer to the positive terminal further comprises:

supporting the substrate on a substrate support having a plurality of contact members disposed on the support perimeter, the contact members coupling the conductive layer to the positive terminal.

4. The method of claim 3, further comprising:

rotating the substrate support.

5. The method of claim 1, wherein the turbulent region is more turbulent proximate the center of the substrate.

6. A method for polishing a substrate having an exposed conductive layer, the method comprising:

flowing a polishing fluid onto the substrate, the polishing fluid forming a boundary layer adjacent the substrate;

creating an area of greater turbulence in a center region of the polishing fluid boundary layer relative to a radially disposed region; and flowing electrical current across the boundary layer to the conductive layer.

7. The method of claim 6, wherein the step of flowing electrical current further comprises:

coupling a negative terminal of a power source to a tube or showerhead having the polishing fluid flowing therethrough.

8. The method of claim 6, wherein the step of flowing electrical current further comprises:

supporting the substrate on a substrate support having a plurality of contact members disposed on the support perimeter in contact with the conductive layer; and coupling the conductive layer to a positive terminal of a power source.

9. The method of claim 6 further comprising:

rotating the substrate support.

10. The method of claim 6, wherein the boundary layer in the radially disposed region is turbulent.

11. The method of claim 6, wherein the boundary layer in the radially disposed region is laminar.

12. A method for polishing a substrate having an exposed conductive layer, the method comprising:

directing a polishing fluid against the exposed conductive layer preferentially to a central region as compared to peripheral regions thereof;

creating a turbulent boundary layer of polishing fluid in the central region; and coupling a source of electrical power across the polishing fluid and the exposed conductive layer of the wafer.

13. The method of claim 12 further comprising rotating the substrate.

14. The method of claim 12, wherein the step of coupling a source of electrical power further comprises:

coupling a negative terminal of a power source the polishing fluid directly or through a tube or showerhead having the polishing fluid flowing therethrough.

15. The method of claim 12, wherein the step of coupling a source of electrical power further comprises:

coupling a positive terminal of a power source the substrate.

16. The method of claim 12 further comprising flowing current across a polishing fluid boundary layer having less resistivity proximate the central region.

17. A method for polishing a substrate having an exposed conductive layer, the method comprising:

rotating the substrate on a substrate support;

coupling a polishing fluid to a negative terminal of a power source;

coupling a positive terminal of the power source to the exposed conductive layer;

delivering the polishing fluid to a center region of the substrate, the polishing fluid having a boundary layer adjacent the substrate; and creating greater turbulence in the boundary layer proximate the center region relative to a region radially disposed on the substrate.

18. A method for polishing a substrate having an exposed conductive layer, the method comprising:

flowing a polishing fluid onto the substrate at a first rate;

forming a polishing fluid boundary layer adjacent the substrate, wherein a center region of the boundary layer is turbulent; and increasing the flow of polishing fluid from the first rate to a second rate.

19. The method of claim 18, wherein the first rate is less than 3.8 l/m.

20. The method of claim 19, wherein the second rate is between about 3.8 to about 22.8 l/m.

21. The method of claim 18, wherein the step of increasing the flow of polishing fluid occurs after the boundary layer is formed.

22. The method of claim 18, wherein the step of flowing the polishing fluid at a first rate further comprises:

rotating the substrate between 0 and about 15 rpm.

23. The method of claim 22, wherein the step of flowing the polishing fluid at a second rate further comprises:

increasing the rotation speed of the substrate.

24. The method of claim 18 further comprising:

creating an area of greater turbulence in the center region of the polishing fluid boundary layer relative to a radially disposed region.

25. The method of claim 18 further comprising:

flowing electrical current across the boundary layer to the conductive layer.

* * * * *

UNITED STATES PATENT AND TRADEMARK OFFICE
CERTIFICATE OF CORRECTION

PATENT NO. : 6,723,224 B2
DATED : April 20, 2004
INVENTOR(S) : Yahalom et al.

It is certified that error appears in the above-identified patent and that said Letters Patent is hereby corrected as shown below:

Column 1,
Lines 60 and 62, please change "electroplating" to -- Electropolishing --.

Column 2,
Lines 17-18, and 31-32, please change "electroplating" to -- electropolishing --.

Column 3,
Lines 37, 46, 58 and 64, please change "electroplating" to -- electropolishing --.

Column 6,
Lines 49, 50, 56 and 59-60, please change "electroplating" to -- electropolishing --.

Column 7,
Line 30, please change "electroplating" to -- electropolishing --.

Column 9,
Line 20, please change "finer" to -- filter --.
Lines 21-22, please change "electroplating" to -- electropolishing --.

Column 11,
Lines 40 and 52, please change "electroplating" to -- electropolishing --.

Signed and Sealed this

Thirty-first Day of August, 2004

JON W. DUDAS
*Director of the United States Patent and Trademark Office*